United States Patent

Bartley et al.

[11] Patent Number: 6,060,692
[45] Date of Patent: May 9, 2000

[54] LOW POWER COMPACT HEATER FOR PIEZOELECTRIC DEVICE

[75] Inventors: Eileen Bartley, Kildeer; Jeffrey Cartwright, Sandwich, both of Ill.

[73] Assignee: CTS Corporation, Elkhart, Id.

[21] Appl. No.: 09/146,011

[22] Filed: Sep. 2, 1998

[51] Int. Cl.[7] .................................................. H05B 1/00
[52] U.S. Cl. ........................................ 219/210; 310/343
[58] Field of Search ................................. 219/210, 209; 257/468; 310/346, 343; 331/69

[56] References Cited

U.S. PATENT DOCUMENTS

| | | | |
|---|---|---|---|
| 2,301,008 | 11/1942 | Baldwin | 219/210 |
| 2,938,099 | 5/1960 | Cheli | 219/210 |
| 3,387,113 | 6/1968 | Charbonnier | 219/209 |
| 3,431,392 | 3/1969 | Garland et al. | 219/210 |
| 3,715,563 | 2/1973 | Bloch | 219/210 |
| 3,809,931 | 5/1974 | White et al. | 310/8.1 |
| 3,818,254 | 6/1974 | Persson | 310/8.1 |
| 3,887,785 | 6/1975 | Ahlport | 219/209 |
| 4,091,303 | 5/1978 | Tadataka et al. | 310/343 |
| 4,334,168 | 6/1982 | Besson et al. | 310/343 |
| 4,564,744 | 1/1986 | Valentin | 219/210 |
| 4,748,367 | 5/1988 | Bloch et al. | 310/343 |
| 4,985,687 | 1/1991 | Long | 331/69 |
| 5,041,800 | 8/1991 | Long et al. | 331/69 |
| 5,289,075 | 2/1994 | Besson et al. | 310/367 |
| 5,696,423 | 12/1997 | Dydyk et al. | 310/346 |
| 5,729,181 | 3/1998 | Cutler et al. | 331/69 |
| 5,818,097 | 10/1998 | Rohlfing et al. | 257/468 |
| 5,917,272 | 6/1999 | Clark et al. | 310/343 |

*Primary Examiner*—Teresa Walberg
*Assistant Examiner*—Quang Van

[57] ABSTRACT

A heater apparatus (10) for a piezoelectric device (12) includes a resistive heating element (18) on an insulating substrate (14). The heating element (18) maintains a temperature of the piezoelectric device (12) within a predetermined temperature range. A plurality of electrical couplings (20) extend through the insulating substrate (14). The electrical couplings (20) electrically connect to the heating element (18) and mechanically and electrically connect to the piezoelectric device (12). The piezoelectric device (12) is suspended above the heating element (18) on at least two of the electrical couplings (20). As a result, the heater apparatus (10) and piezoelectric device (12) can be enclosed within a standard crystal package.

20 Claims, 3 Drawing Sheets

LOW POWER COMPACT HEATER FOR PIEZOELECTRIC DEVICE

FIELD OF THE INVENTION

The present invention relates generally to piezoelectric crystal devices and, in particular, to an apparatus and method to heat a crystal device for temperature compensation.

BACKGROUND OF THE INVENTION

Oven compensated crystal oscillators (OCXOs) are commonly found in analog and digital radio communication base stations to maintain a high frequency stability of typically ten parts per billion or less over a large temperature range. However, the operating frequency of a piezoelectric resonator will vary much more than this over temperature, generally on the order of twenty parts per million. To compensate, prior art OCXOs enclose a piezoelectric resonator within an oven to maintain the piezoelectric resonator within a small operating temperature range, no matter what the temperature outside of the oven.

Most prior art oven configurations have included a miniaturizing oven compartment, i.e. an insulated steel enclosed compartment with an enclosed resistive heating element, which surrounds a packaged piezoelectric resonator. These OCXOs are relatively large (several cubic inches) and draw a relatively large amount of current (100 mA).

Other prior art oven configurations have included a resistive heating element disposed directly onto the piezoelectric device itself, within the resonator packaging. Although this reduces the size of an OCXO, other problems arise. In particular, special crystal plating processes must be used, and the heating element adds contamination, adverse mass-loading, high thermal gradients, and stress to the piezoelectric device which results in undesirable frequency shifts and aging. Moreover, there are size constraints on the heating element as it must share space on the piezoelectric substrate with the existing electrodes.

The trend in radio base stations is towards more stable operating frequencies with smaller packaging and less power consumption without added costs due to special processing.

Therefore, there is a need for a heater apparatus for a piezoelectric device that does not require special processing or detract from the resonator performance or frequency stability. It would also be an improvement in the art if an OCXO could be provided that does not have a size or cost penalty and draws minimal current.

DETAILED DESCRIPTION OF THE PREFERRED EMBODIMENT

The present invention provides a heater apparatus within a standard-sized crystal package wherein the heating element is disposed on an insulating substrate separate from the piezoelectric substrate and in thermal contact with the package. Advantageously, the piezoelectric device does not require special processing and maintains its inherent performance and frequency stability. Therefore, the present invention does not have a size or cost penalty. In addition, the thermal contact of the heating element to the package through the insulating substrate provides more uniform heating while drawing a minimal amount of current.

Figure 1:
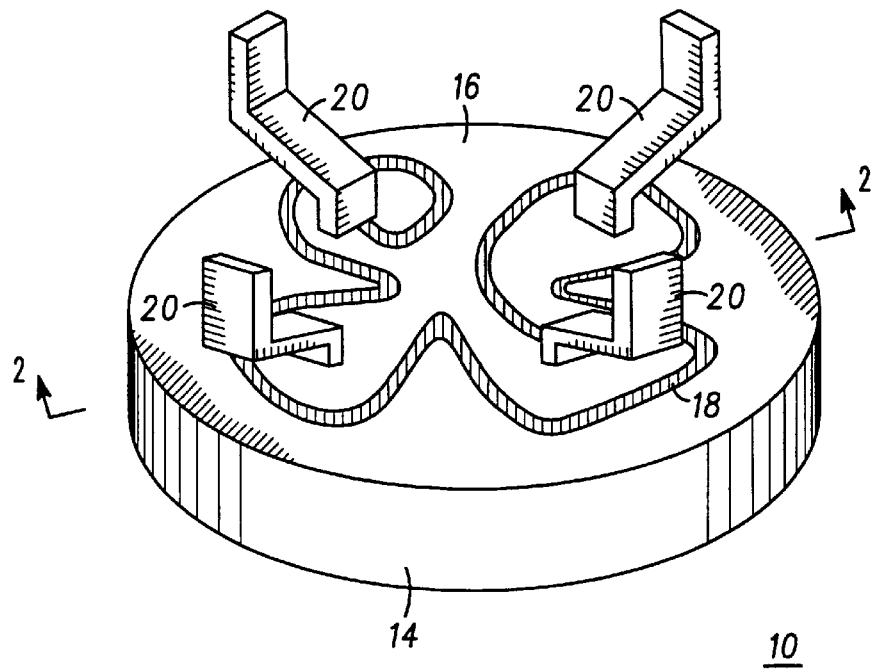
FIG. 1 shows a perspective view of a first embodiment of heater apparatus for a piezoelectric device, in accordance with the present invention.
Figure 2:
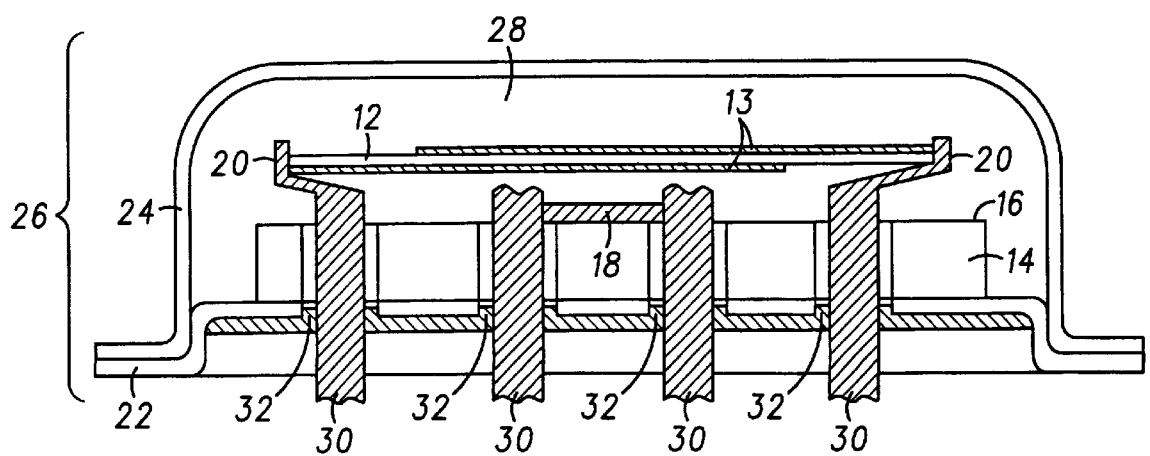
FIG. 2 shows a cross sectional view of a preferred embodiment of a heater apparatus of FIG. 1 in a packaged piezoelectric device, in accordance with the present invention.

FIGS. 1 and 2 show a first embodiment of a heater apparatus 10 for a piezoelectric device 12, in accordance with the present invention. The piezoelectric device 12 is typically a round or rectangular plate with disposed opposing electrodes 13, as is known in the art. It can be a resonator, filter or surface acoustic wave device. In the example shown, the piezoelectric device 12 is an AT or ST-cut quartz resonator. However, it should be recognized that the present invention will work for all types of piezoelectric devices and materials.

An insulating substrate 14 is provided with an upper surface 16. A resistive heating element 18 is disposed on the upper surface 16 of the insulating substrate 14. The heating element 18 maintains the temperature of the piezoelectric device 12 within a predetermined temperature range. The heating element 18 can be of many conductive materials. Preferably, the heating element 18 is made of nichrome due to its low cost, ease of deposition, and low outgassing. Preferably, the heating element 18 is disposed in a serpentine pattern on the upper surface 16 of the insulating substrate 14 so as to increase its heating effectiveness.

The insulating substrate can be of any insulating material. For example, ceramics such as alumina, aluminum nitride or beryllium nitride can be used. It is desirable to provide a material with high thermal conductivity, but at a reasonable cost. Therefore it is preferred that the insulating substrate 14 is made of aluminum nitride due to its beneficial combination of high thermal conductivity, low cost, ease of manufacturability, and low outgassing. In particular, aluminum nitride has a thermal conductivity of about 135 watts/meter-Kelvin (W/m-K) versus 20.3 W/m-K for alumina. However, it should be recognized that other materials having a high thermal conductivity, low cost, and low coefficient of thermal expansion can be used equally well.

A plurality of electrical couplings 20 extend through the insulating substrate 14. The electrical couplings 20 consist of at least one of wire leads and foils formed to mount the piezoelectric device 12. For example, straight wire electrical leads can extend through the insulating substrate 14 with foil leads spot welded to the wire leads above the insulating substrate 14. The foil leads are formed to accommodate the piezoelectric device 12 which can be mounted with conductive epoxy or silicone. Alternatively, foil leads can be ultrasonically welded to metallized traces on the insulating substrate 14 connecting to vias through the insulating substrate 14 or to metallized traces that wrap around the insulating substrate 14.

The electrical couplings 20 electrically connect to the heating element 18 and the piezoelectric device 12. The electrical couplings 20 also provide a mechanical support and mounting connection for the piezoelectric device 12 wherein the piezoelectric device 12 is suspended above the heating element 18 on at least two of the electrical couplings 20. It is desirable to mount the piezoelectric device 12 close to the heating element 18 but without the possibility of contact therebetween due to thermal or mechanical shock effects. Generally four electrical couplings 20 are used. However as few as two electrical couplings are required if external DC blocking capacitors are used in the connections to the piezoelectric device, i.e. the heating element 18 and piezoelectric device 12 are connected in parallel.

The positioning of the heating element in proximity to, but separate from, the piezoelectric devices has several advantages over the prior art on-resonator heaters. Firstly, the piezoelectric device does not require special processing and maintains its inherent performance and frequency stability. Therefore, the present invention does not have a cost or performance penalty. Secondly, the distance of the heating element from the piezoelectric device provides more uniform heating than prior art heaters while drawing a minimal amount of current. Thirdly, the heating element does not produce contamination, adverse mass-loading, high thermal gradients, or stress to the piezoelectric device as occurs in the prior art. Fourthly, there are less size constraints on the heating element than in prior art.

In a preferred embodiment, the present invention further includes a base 22 and a lid 24 defining a hermetic package 26. The hermetic package 26 encloses the piezoelectric device 12, insulating substrate 14, and heating element 18 within a hermetic environment 28. The insulating substrate 14 abuts the hermetic package 26 providing a thermal contact with the hermetic package 26 such that heat transfer is maximized between the insulating substrate 14 and the hermetic package 26. The intimate thermal contact preferentially directs heat through the package and around the piezoelectric device so as provide more uniform thermal heating of the piezoelectric device.

The electrical couplings 20 consisting of electrical leads 30 extending through hermetic seals 32 in the base 22. The hermetic environment 28 is necessary to achieve maximum frequency stability of the piezoelectric device 12. In particular, the base 22 and lid 24 are of metal which are hermetically sealed together, and the hermetic seals 32 are of glass surrounding the electrical leads 30 through the base 22.

Preferably, the base 22 and the lid 24 are cold welded together to define the hermetic package 26. Cold welding introduces the least amount of contamination and stress into the hermetic package 26. More preferably, the hermetic environment 28 consists of at least one of the group of helium, nitrogen, and vacuum. This can be accomplished by backfilling or evacuating the package before sealing, as is known in the art. Using a vacuum environment provides the least amount of contamination, but this limits heat transfer to either conduction through the package or radiation. Using a dry inert environment, such as helium or nitrogen, provides the additional thermal transfer mode of convection heating. Each of the environments listed above can be used equally well in the present invention.

To provide more uniform heating, it is preferred the base 22 and the lid 24 contain a first metal alloy having a first thermal conductivity and the electrical couplings 20 be made of a second metal alloy having a second thermal conductivity less than 5% that of the first metal alloy. This is one of the novel aspects of the present invention wherein heat from the heating element is preferentially distributed around the piezoelectric device 12, through the thermal contact of the insulating substrate 14 with the base 22 and the lid 24, rather than directly to the piezoelectric device 12 through the electrical couplings 20. Moreover, radiative heat directed to the piezoelectric device 12 through the hermetic environment 28 is not appreciable at the nominal operating temperatures. Therefore, the thermal configuration described above provides more uniform heating of the piezoelectric device 12 reducing thermal gradients and stress therein.

In particular, the base and lid 24 are made of a steel or Kovar core with a cladding made of a relatively high thermal conductivity metal. More particularly, a predominantly copper alloy having a thermal conductivity of about 390 W/m-K is used as the cladding. However, it should be recognized that other metals or alloys having a high thermal conductivity, low cost, and good cold welding properties can be used equally well. The electrical couplings 20 are made of Kovar having a thermal conductivity of about 10.2 W/m-K. Preferably, the electrical couplings 20 are isolated from direct contact with the insulating substrate 14. Moreover, the electrical couplings 20 are thermally isolated from the base 22 by hermetic seals 32 made of a low thermal conductivity glass.

Another advantage of the present invention is that standard industry packaging can be used. For example, standard T-03 and T-08 headers can be manufactured very easily with an insulating substrate without any modification to the headers themselves. This retains the low cost and size advantage of using standard headers.

Figure 3:
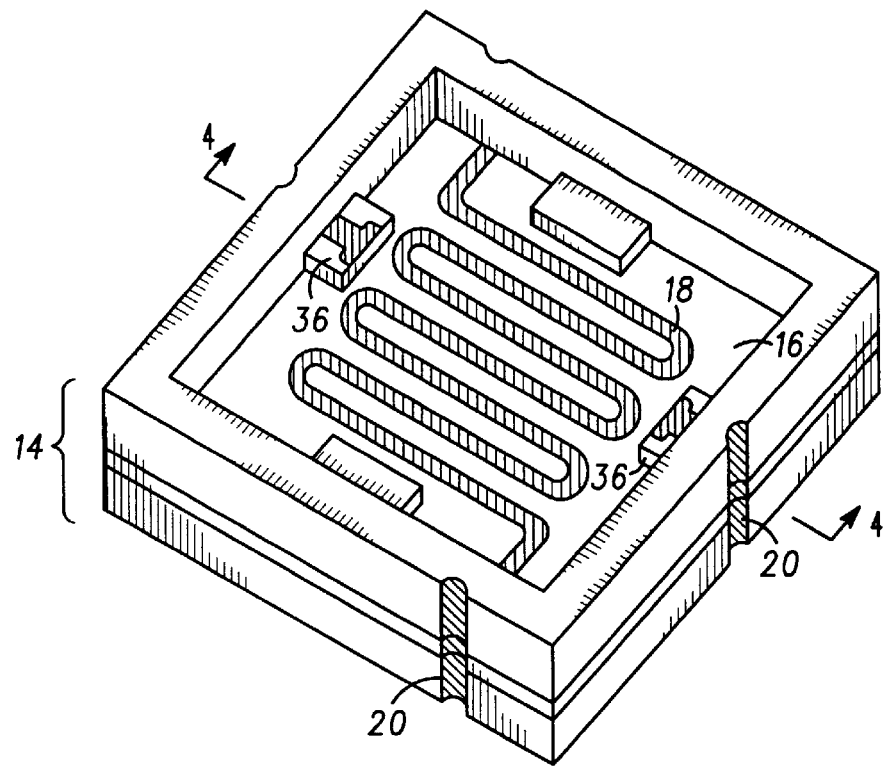
FIG. 3 shows a perspective view of a second embodiment of a heater apparatus for a surface mount piezoelectric device, in accordance with the present invention.
Figure 4:
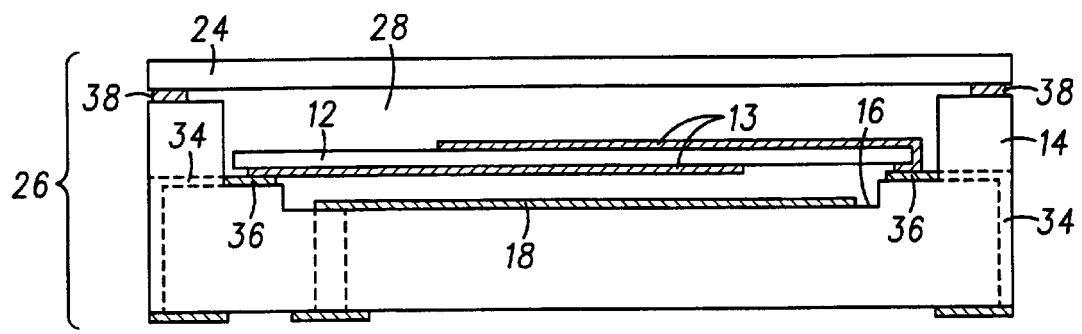
FIG. 4 shows a cross sectional view of the heater apparatus of FIG. 3 in a surface mount packaged piezoelectric device, in accordance with the present invention.

In an alternate embodiment of the present invention, as shown in FIGS. 3 and 4, a surface mount version of the heater apparatus is provided. This embodiment is identical with the description of the above preferred embodiment, which is hereby incorporated by reference, with the exception of the insulating substrate 14 serving as the base in a surface mount hermetic package 26. In this alternate embodiment, the insulating substrate 14 and lid 24 are sealed together to define the hermetic package 26. The hermetic package 26 encloses the piezoelectric device 12 and heating element 18 within a hermetic environment 28.

In addition, the electrical couplings 20 consisting of metallized traces 34 extending through and on the insulating substrate 14 to provide mounting and connection pads 36 for the piezoelectric device 12 and heating element 18. Optionally, the metallized traces 34 can consist of filled vias extending through the insulating substrate as is known in the art.

The alternate embodiment can include several hermetically sealed configurations and sealing means 38. In a first configuration, a ceramic lid 24 is supplied which is soldered (represented as 38) to the insulating substrate. In a second configuration, a ceramic lid 24 is supplied which is fired with a glass frit (represented as 38) between the lid 24 and the insulating substrate. In a third configuration, a metal seal ring (represented as 38) is disposed on the insulating substrate 14, and a metal lid 24 is welded to the seal ring. In this third configuration, any combination of metal melting operations can be utilized. For example, the seal ring (represented as 38) can be brazed to a disposed metal trace on the insulating substrate 14, and the lid 24 can be cold welded, seam welded, resistance welded, or laser welded to the seal ring. Moreover, it should be recognized that the shape of the seal ring (shown as 38) can be changed to accommodate any of the various welding techniques. As explained previously, a hermetic environment 28 is preferred consisting of at least one of the group of helium, nitrogen, and vacuum. This can be accomplished by backfilling or evacuating the package before sealing, as is known in the art.

In practice, the present invention is utilized in an oven compensated crystal oscillator (OCXO) application with the present invention replacing the conventional oven apparatus. Optionally, with the addition of two more leads as may already exist in a T-08 header for example, a temperature sensor (not shown) can be enclosed within the hermetic package and electrically connected to at least two of the electrical couplings, e.g. disposed on the insulating substrate. Temperature sensors typically include thermistors, bare transistors dies, thermocouples and the like, as are known in the art. The temperature sensor is connected to a temperature monitoring circuit of the OCXO for maintaining the temperature of the piezoelectric device within a predetermined temperature range.

Preferably, an AT-cut or SC-cut quartz resonator is used in the OCXO application and is operated such that the predetermined temperature range is centered on a turnover temperature of the quartz resonator and has a width of less than ±2° C. As is known in the art, the turnover temperature of a piezoelectric resonator is that point on a frequency-temperature response curve where there is little or no change in frequency for a minor change in temperature. Therefore, if a piezoelectric resonator can be held at its turnover temperature within a narrow temperature range, it's frequency will stay substantially the same.

AT-cut and SC-cut quartz resonators are particularly suited for OCXO applications as their turnover temperatures occur above room temperature. For example, AT-cut quartz resonators have a turnover temperature of about 55° C., and ST-cut quartz resonators have a turnover temperature of about 85° C. Either of these resonators types, held within a ±2° C. temperature around their turnover temperature, will exhibit very stable operating frequency.

Alternatively, an OCXO can be configured to maintain a piezoelectric resonator such that it never goes below a certain low temperature point, but is allowed to go above that low temperature point, i.e. wherein the predetermined temperature range extends from a low temperature point up to a maximum operating temperature of the oven compensated crystal oscillator such that the piezoelectric resonator always operates between the low temperature point and the maximum operating temperature. This type of OCXO configuration requires a supplement temperature compensation mechanism of which many are known in the art. For example, in a typical temperature compensated crystal oscillator (TCXO), a piezoelectric resonator is capacitively loaded to change frequency over temperature to exactly complement its natural drift in frequency over temperature. This capacitive loading is preprogrammed in a memory of the TCXO. However, TCXOs are still less stable than OCXOs and have particular difficulty compensating a piezoelectric resonator at low temperatures due to their steep non-linear frequency-temperature responses at low temperatures.

The aforementioned OCXO-TCXO hybrid approach solves this problem by only turning the oven on where the piezoelectric resonator enters a environment colder than the low temperature point. Advantageously, this hybrid approach improves the frequency stability over a standard TCXO making it much easier to compensate, and uses much less average oven current than a standard OCXO.

Figure 5:
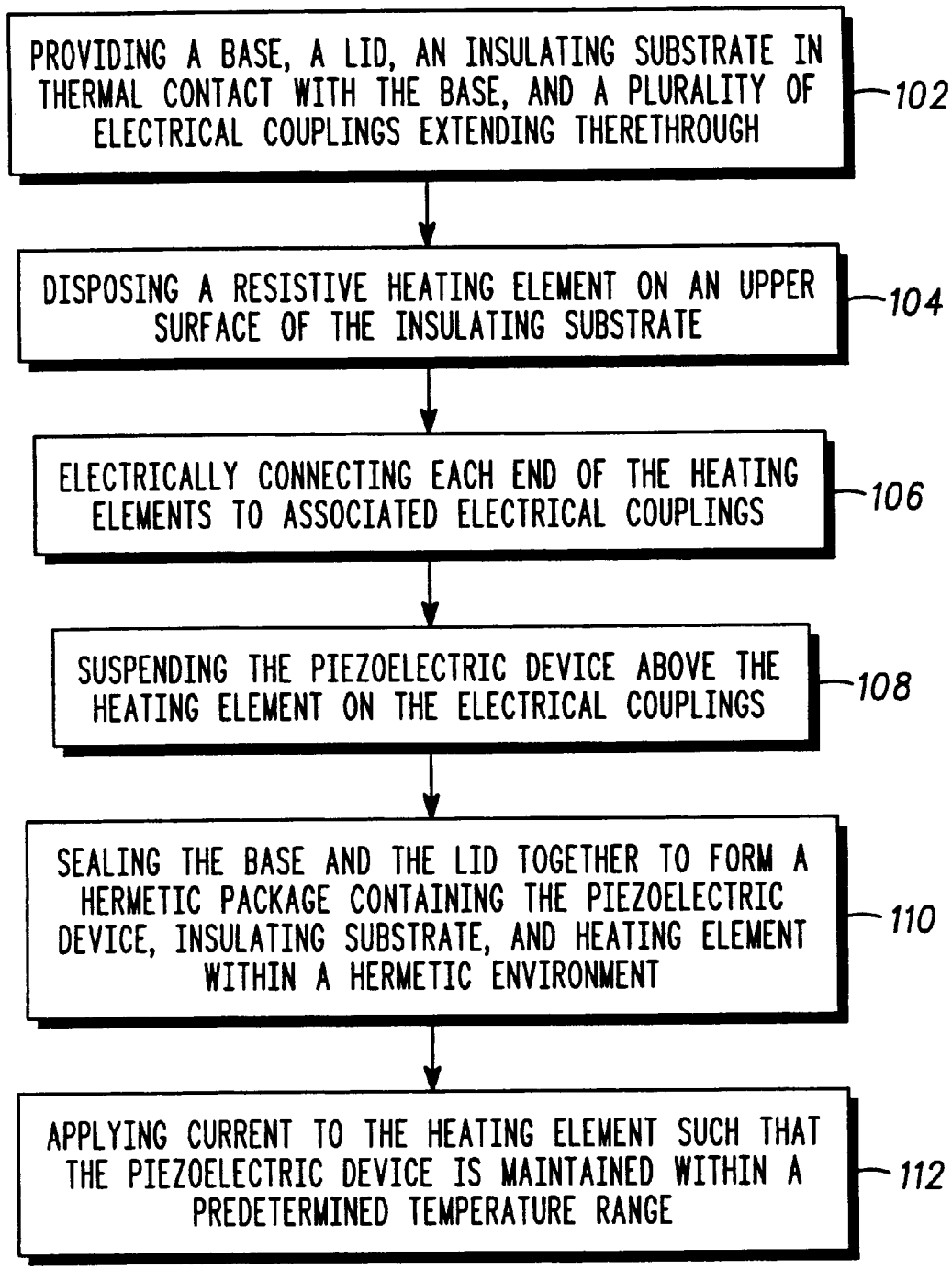
FIG. 5 shows a flow diagram of a method for heating a piezoelectric device, in accordance with the present invention.

FIG. 5 shows a method 100 of heating a piezoelectric device. A first step 102 of the method 100 includes providing a base, a lid, and an insulating substrate with a plurality of electrical couplings extending therethrough. The insulating substrate is in thermal contact with the base and the electrical couplings extend through hermetic seals in the base.

A second step 104 includes disposing a resistive heating element on an upper surface of the insulating substrate.

A third step 106 includes electrically connecting each end of the heating element to associated electrical couplings.

A fourth step 108 includes suspending the piezoelectric device above the heating element on at least two of the electrical couplings such that the piezoelectric device is mechanically and electrically connected thereto.

A fifth step 110 includes sealing the base and the lid together to form a hermetic package containing the piezoelectric device, insulating substrate, and heating element within a hermetic environment.

A sixth step 112 includes applying current to the heating element through the associated electrical couplings such that the piezoelectric device is maintained within a predetermined temperature range.

In a preferred embodiment, the sealing step includes backfilling the hermetic package with a hermetic environment consisting of at least one of the group of helium, nitrogen, and vacuum. In addition, the sealing step includes cold welding the base and the lid together to define the hermetic package.

Preferably, the providing steps includes the base and lid containing a first metal alloy having a first thermal conductivity and the electrical couplings being made of a second metal alloy having a second thermal conductivity less than 5% that of the first metal alloy such that during the applying step heat from the heating element is preferentially distributed around the piezoelectric resonator, through the base and the lid, rather than directly to the piezoelectric device.

More preferably, the present invention further includes a step of providing a temperature sensor enclosed within the hermetic package and electrically connected to at least two of the electrical couplings, e.g. disposing a temperature sensor onto the insulating substrate and connecting it to the electrical couplings.

In practice, the disposing step includes disposing a nichrome heating element in a serpentine pattern on the upper surface of the insulating substrate. Disposing nichrome provides less potential for contamination of the hermetic package during the applying step.

Preferably, the applying step includes the predetermined temperature range being centered on a turnover temperature of the piezoelectric device and having a width of less than ±2° C.

Alternatively, the applying step includes the predetermined temperature range extending from a low temperature point up to a maximum operating temperature of the piezoelectric device such that the piezoelectric device always operates between the low temperature point and the maximum operating temperature.

One of the novel aspects of the present invention is a method to heat a piezoelectric device that does not require special process steps for the piezoelectric device, thereby preserving frequency stability at no additional cost. In addition, the present invention provides more uniform heating than prior art heaters while drawing a minimal amount of current. Moreover, the heating process does not produce contamination, high thermal gradients, or stress to the piezoelectric device as occurs in the prior art.

Advantageously, the present invention provides an OCXO of 10 ppb frequency stability with a current draw of 30 mA. Also, it should be understood that the heater apparatus of the present invention can be advantageously utilized in any radio.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A heater apparatus for a piezoelectric device, comprising:

an insulating substrate having an upper surface;

a resistive heating element is disposed on the upper surface of the insulating substrate, said heating element for maintaining the temperature of the piezoelectric device within a predetermined temperature range;

a plurality of electrical couplings extending through the insulating substrate, the electrical couplings for electrically connecting to the heating element and for mechanically and electrically connecting to the piezoelectric device; and a hermetic package comprising a lid and a base, said base defining apertures therethrough and including hermetic seals in said apertures, said hermetic package enclosing the piezoelectric device, insulating substrate, and heating element within a hermetic environment, said electrical couplings consisting of electrical leads extending through said hermetic seals in the base;

the insulating substrate abuts the hermetic package providing a thermal contact with the hermetic package such that heat transfer is maximized between the insulating substrate and the hermetic package, and the piezoelectric device being suspended above the heating element on at least two of the electrical couplings.

2. The heater apparatus of claim 1, wherein the base and lid contain a first metal alloy having a first thermal conductivity and the electrical couplings are made of a second metal alloy having a second thermal conductivity less than 5% that of the first metal alloy such that heat from the heating element is preferentially distributed around the piezoelectric device, through the thermal contact with the base and the lid, rather than directly to the piezoelectric device.

3. The heater apparatus of claim 1, wherein the base and the lid are cold welded together to define the hermetic package, and wherein the hermetic environment consists of at least one of the group consisting of helium, nitrogen, and vacuum.

4. The heater apparatus of claim 1, wherein the heating element consists of nichrome, and wherein the heating element is disposed in a serpentine pattern on the upper surface of the insulating substrate.

5. The heater apparatus of claim 1, further comprising a temperature sensor enclosed within the hermetic package and electrically connected to at least two of the electrical couplings.

6. The heater apparatus of claim 1, wherein the insulating substrate has a thermal conductivity that is higher than a thermal conductivity of the electrical couplings.

7. An oven compensated crystal oscillator having a heater within a piezoelectric resonator package, comprising:

an insulating substrate with an upper surface;

a resistive heating elements is disposed on the upper surface of the insulating substrate, said heating element for maintaining the temperature of a piezoelectric resonator within a predetermined temperature range;

a plurality of electrical couplings extending through the insulating substrate, the electrical couplings for electrically connecting to the heating element and for mechanically and electrically connecting to the piezoelectric resonator; and a hermetic package comprising a lid and a base, said base defining apertures therethrough and including hermetic seals in said apertures, said hermetic package enclosing the piezoelectric resonator, insulating substrate, and heating element within a hermetic environment, and said electrical couplings consisting of electrical leads extending through said hermetic seals in the base;

the insulating substrate abuts the hermetic package providing a thermal contact with the hermetic package such that heat transfer is maximized between the insulating substrate and the hermetic package, and the piezoelectric resonator being suspended above the heating element on at least two of the electrical couplings;

the base and lid contain a first metal alloy having a first thermal conductivity and the electrical couplings are made of a second metal alloy having a second thermal conductivity less than 5% that of the first metal alloy such that heat from the heating element is preferentially distributed around the piezoelectric resonator, through the base and the lid, rather than directly to the piezoelectric resonator.

8. The oven compensated crystal oscillator of claim 7, wherein the base and the lid are cold welded together to define the hermetic package, and wherein the hermetic environment consists of at least one of the group consisting of helium, nitrogen, and vacuum.

9. The oven compensated crystal oscillator of claim 7, wherein the heating element consists of nichrome, and wherein the heating element is disposed in a serpentine pattern on the upper surface of the insulating substrate.

10. The oven compensated crystal oscillator of claim 7, wherein the predetermined temperature range is centered on a turnover temperature of the piezoelectric resonator and has a width of less than ±2° C.

11. The oven compensated crystal oscillator of claim 7, wherein the predetermined temperature range extends from a low temperature point up to a maximum operating temperature of the oven compensated crystal oscillator such that the piezoelectric resonator always operates between the low temperature point and the maximum operating temperature.

12. The oven compensated crystal oscillator of claim 7, further comprising a temperature sensor enclosed within the hermetic package and electrically connected to at least two of the electrical couplings.

13. The oven compensated crystal oscillator of claim 7, wherein the insulating substrate has a thermal conductivity that is higher than a thermal conductivity of the electrical couplings.

14. A method of heating a piezoelectric device contained within a hermetic package, comprising the steps of:

providing a base of said hermetic package having apertures defined therethrough with hermetic seals sealing said apertures, a lid, and an insulating substrate with a plurality of electrical couplings extending therethrough, the insulating substrate being in thermal contact with the base such that heat transfer is maximized between the insulating substrate and said base of said hermetic package, and the electrical couplings extending through said hermetic seals in the base;

disposing a resistive heating element on an upper surface of the insulating substrate;

electrically connecting each end of the heating element to associated electrical couplings;

suspending the piezoelectric device above the heating element on at least two of the electrical couplings such that the piezoelectric device is mechanically and electrically connected thereto;

sealing the base and the lid together to form said hermetic package containing the piezoelectric device, insulating substrate, and heating element within a hermetic environment; and applying current to the heating element through the associated electrical couplings such that the piezoelectric device is maintained within a predetermined temperature range.

15. The method of claim 14, wherein the providing step includes the base and lid containing a first metal alloy having a first thermal conductivity and the electrical couplings being made of a second metal alloy having a second thermal conductivity less than 5% that of the first metal alloy such that during the applying step heat from the heating element is preferentially distributed around the piezoelectric device, through the base and the lid, rather than directly to the piezoelectric device.

16. The method of claim 14, wherein the sealing step includes backfilling the hermetic package with a hermetic environment consisting of at least one of the group consisting of helium, nitrogen, and vacuum, and further includes cold welding the base and the lid together to define the hermetic package.

17. The method of claim 14, wherein the disposing step includes disposing a nichrome heating element in a serpentine pattern on the upper surface of the insulating substrate.

18. The method of claim 14, wherein the applying step includes the predetermined temperature range being centered on a turnover temperature of the piezoelectric device and having a width of less than ±2° C.

19. The method of claim 14, wherein the applying step includes the predetermined temperature range extending from a low temperature point up to a maximum operating temperature of the piezoelectric device such that the piezoelectric device always operates between the low temperature point and the maximum operating temperature.

20. The method of claim 14, further comprising a step of providing a temperature sensor enclosed within the hermetic package, the temperature sensor being electrically connected to at least two of the electrical couplings.

* * * * *